United States Patent [19]
Jaso et al.

[11] Patent Number: 5,894,152
[45] Date of Patent: Apr. 13, 1999

[54] SOI/BULK HYBRID SUBSTRATE AND METHOD OF FORMING THE SAME

[75] Inventors: Mark A. Jaso, Manassas, Va.; Jack A. Mandelman, Stormville, N.Y.; William R. Tonti, Essex Junction, Vt.; Matthew R. Wordeman, Mahopac, N.Y.

[73] Assignee: International Business Machines Corporation, Armonk, N.Y.

[21] Appl. No.: 08/878,225

[22] Filed: Jun. 18, 1997

[51] Int. Cl.⁶ .......................... H01L 27/01; H01L 27/12; H01L 31/0392
[52] U.S. Cl. .............................. 257/347; 257/67
[58] Field of Search .................. 257/67, 69, 347

[56] References Cited

U.S. PATENT DOCUMENTS

| | | |
|---|---|---|
| 3,943,555 | 3/1976 | Mueller et al. . |
| 5,032,529 | 7/1991 | Beitman et al. . |
| 5,399,507 | 3/1995 | Sun . |
| 5,484,738 | 1/1996 | Chu et al. . |
| 5,548,149 | 8/1996 | Joyner . |
| 5,554,546 | 9/1996 | Malhi . |
| 5,554,870 | 9/1996 | Fitch et al. . |
| 5,581,101 | 12/1996 | Ning et al. ........................ 257/347 |
| 5,583,358 | 12/1996 | Kenny ............................... 257/621 |
| 5,589,695 | 12/1996 | Malhi ................................ 257/77 |
| 5,818,069 | 10/1998 | Kadesh et al. .................... 257/67 |

FOREIGN PATENT DOCUMENTS 0 610 599A1  12/1993  European Pat. Off. .

OTHER PUBLICATIONS

IBM/Selective SOI and Integration with Planar Oxide–Isolated Bulk Devices/vol. 35 No. 5 Oct. 1992.

SOI/Bulk Hybrid Technology on Simox Wafers for High Performance Circuits with Good ESD Immunity/Manuscript/1995.

Proceedings 1996 IEEE International SOI Conference, Oct. 1996/Floating-Body Concerns for SOI Dynamic Random Access Memory.

*Primary Examiner*—Ngân V. Ngô
*Attorney, Agent, or Firm*—Schmeiser Olsen & Watts; Howard J. Walter, Jr.

[57] ABSTRACT

A semiconductor device having areas that are semiconductor on insulator ("SOI") and areas that are bulk, single crystalline semiconductive areas is provided in which conductive spacers may be formed to electrically connect the SOI areas to ground in order to overcome floating body effects that can occur with SOI. Additionally, insulative spacers may be formed on the surface of the conductive spacers to electrically isolate the SOI regions from the bulk regions. A novel method for making both of these products is provided in which the epitaxially grown, single crystalline bulk regions need not be selectively grown, because a sacrificial polishing layer is deposited, is also provided.

19 Claims, 3 Drawing Sheets

SOI/BULK HYBRID SUBSTRATE AND METHOD OF FORMING THE SAME

BACKGROUND OF THE INVENTION

1. TECHNICAL FIELD

The present invention relates generally to semiconductor devices and, more specifically, to a semiconductor substrate having both bulk chip areas and areas of silicon on insulator in which selected areas of silicon on insulator are electrically connected to the wafer so as to reduce floating body problems and methods of forming the same.

2. RELEVANT ART

Conventional or bulk semiconductor devices are formed in semiconductive material by implanting a well of either P-type or N-type material in a wafer of either type material. Gates and source/drain diffusions are then manufactured using commonly known processes. These form devices known as metal-oxide-semiconductor (MOS) field effect transistors or FETs. When a given chip uses both P-type and N-type, it is known as a complementary metal oxide semiconductor ("CMOS"). Each of these devices must be electrically isolated from the others in order to avoid shorting of the circuits. A relatively large amount of surface area is needed for the electrical isolation of the various FETs, which is undesirable in the current trends of size reduction and greater integration. Additionally, parasitic paths and junction capacitance problems may also occur because of the source/drain diffusions' physical proximity to other FET's and the bulk substrate. These problems also result in difficulties when trying to scale down to the sizes necessary for greater integration. Furthermore, sub-threshold slope and substrate sensitivity result in difficulties in scaling bulk CMOS technology to low-voltage applications.

In order to deal with these problems, silicon on insulator ("SOI") has been gaining popularity. However, SOI suffers from the problems of self-heating, electrostatic discharge susceptibility, low breakdown voltage, and dynamic floating body effects which present problems for passgate devices and devices requiring tight threshold voltage control. Floating body effect occurs when the body of the device is not connected to a fixed potential and, therefore, the device takes on charge based on the history of the device. Specifically, in dynamic random access memory ("DRAM") the floating body effect can be especially detrimental because it is critical that the pass transistor stays in the "off" condition to prevent charge leakage from the storage capacitor. Another problem that is specific to SOI is that the formation of large value capacitors (i.e., for decoupling applications) is very difficult because a specific purpose of SOI is to reduce junction capacitance. Additionally, the thin layer of semiconductor makes it difficult to create low resistance discharge paths for electrostatic discharge ("ESD") devices.

Because of these drawbacks, it has been suggested that the best scenario would be to combine areas of SOI for high performance support devices, with adjacent bulk devices for low leakage memory arrays. However, forming both the SOI areas and the bulk areas is difficult at best.

SUMMARY OF THE INVENTION

The present invention provides an SOI/bulk hybrid semiconductor substrate comprising a single crystalline substrate having an upper surface, a first surface area on the upper surface comprising an SOI region, a second surface area on the upper surface comprising a single crystalline region having substantially the same crystal structure as the substrate, and a conductive electrode formed only at a portion of the perimeter of the SOI region electrically connecting the semiconductor of the SOI to the substrate, the resistivity of the electrode being substantially less than that of any of the semiconductor regions to which it makes contact. Another alternative is provided in which the conductive electrode is electrically isolated from the bulk region by first forming the conductive spacers and then forming an overlying dielectric spacer on the surface of the conductive electrode.

The hybrid semiconductor substrate may be manufactured by initially providing a standard SOI wafer comprising a bulk semiconductor substrate, a layer of an oxide on an upper surface of the substrate, and a thin layer of single crystal semiconductor material on an upper surface of the oxide layer. A thin layer of a polish stop material, such as silicon nitride is deposited (5–10 nm) followed by a layer of sacrificial material that may be etched selective to the polish stop, such as silicon dioxide (100 nm). Openings are patterned in the oxide layer and etched through the nitride, SOI, and back oxide, stopping on the surface of the substrate. Spacer material is deposited on the entire surface and then reactive ion etched back to form spacers on the sidewalls of the openings. Single crystalline silicon is then epitaxially grown. The surface of the entire structure is then planarized by chemical mechanical polishing. The areas of single crystal epitaxial silicon and SOI may then be processed to form the appropriate devices on the planar surface.

Accordingly, it is an advantage of the present invention that the bulk devices and the SOI devices may be formed on a planar surface in order to form bulk/SOI hybrids without having topology problems resulting from photolithographic depth of focus problems.

It is a further advantage that the method provides the ability to selectively form areas that will allow for isolation or connection depending upon the device requirements.

Yet another advantage is that the SOI devices may be electrically connected to the substrate or ground in order to eliminate floating body effects and, also, to increase the effectiveness of electrostatic discharge devices.

Numerous other advantages and features of the present invention will become readily apparent from the following detailed description of the invention, the drawings and the appended claims.

BRIEF DESCRIPTION OF THE DRAWINGS

For an understanding of the nature and advantages of the present invention, reference should be made to the following detailed description taken in connection with the accompanying drawings wherein.

DETAILED DESCRIPTION OF PREFERRED EMBODIMENTS

Figure 1:
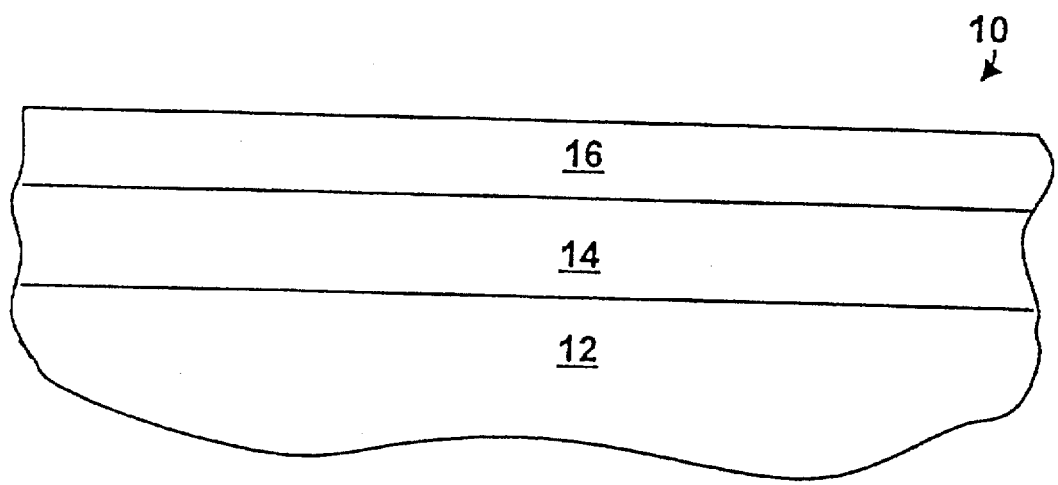
FIG. 1 is a cross-sectional schematic of a first step in practicing the method of the present invention.
Figure 2:
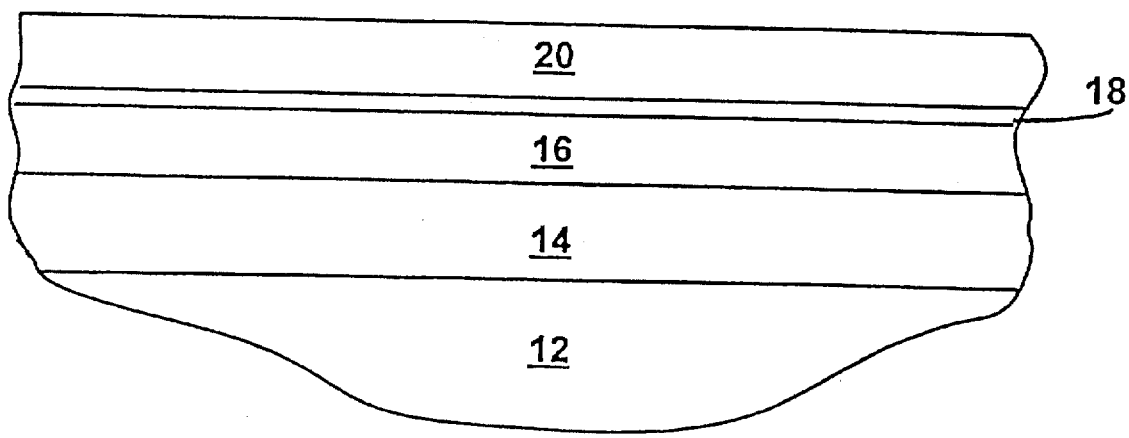
FIG. 2 is a cross-sectional schematic of a second step in practicing the method of the present invention.

As shown in FIG. 1, a standard silicon on insulator ("SOI") substrate is provided. The standard SOI is a single crystalline semiconductor having a substantially planar surface and includes an insulative layer 14 and a thin semiconductive layer 16 in a first surface area on the planar surface and a bulk area 12 in a second surface area of the planar surface. The bulk area 12 is a single crystalline region having substantially the same crystalline structure as the planar surface. The insulative layer 14 is typically a silicon oxide and the single crystalline semiconductor materials are usually silicon. The substrate may be manufactured in a number of different ways including: silicon implanted with oxide ("SIMOX") in which the bulk wafer is high energy implanted with a large dose of oxygen; bond and etch back ("BE-SOI") in which two bulk wafers have an oxide grown on a surface and a dopant profile is incorporated in one of the wafers to act as a marker layer, the two oxide surfaces are bonded together and then one of the wafers is etched back to the marker dopant layer; or a method known as "smart cut" in which one of the wafers is hydrogen implanted before the first wafer is bonded to the second wafer, the two are bonded together and then the excess silicon of one of the wafers is cracked off using the hydrogen in the silicon structure to cause the cracking in the proper level, or by any other suitable means of making SOI. Once the SOI substrate has been formed, a thin polish stop layer 18 (see FIG. 2), typically in the range of from about 5 nm to about 10 nm, of silicon nitride is deposited on the thin layer of silicon. A sacrificial layer, in this case an oxide layer 20, typically about 100 nm thick, is then deposited on the thin nitride layer 18, as shown in FIG. 2. The oxide layer 20 serves to provide a buffer region for subsequently grown epitaxial ("epi") silicon. The buffer region avoids epi overgrowth on the nitride layer, thus improving the crystal quality at the edges of the array block, as will be explained further hereinafter.

Figure 3:
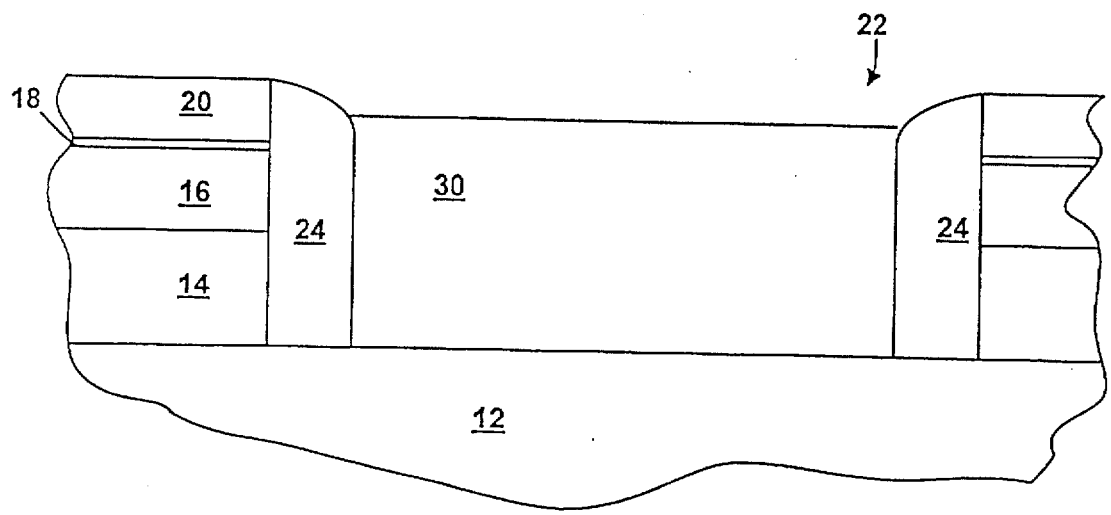
FIG. 3 is a cross-sectional schematic of a third step in practicing the method of the present invention.

As shown in FIG. 3, openings 22 are formed in the oxide layer by the usual methods, typically by photolithographically defining the area using a photoresist material and then etching the defined area. The materials are etched through the oxide 20, nitride 18, SOI and back oxide layers 14 and 16, stopping on the top of the bulk substrate 12. These openings will form the array blocks in a DRAM product or the like. Electrically insulating spacers, such as nitride, or electrically conducting spacers, such as polysilicon 24 may then be formed in chosen locations around portions of the perimeter of the semiconductor on insulator region. If a conductive spacer 24 is used, it will serve to electrically connect the semiconductor 16 of the SOI region to the substrate, because the resistivity of the spacer is substantially lower than that of any of the semiconductor regions to which it makes contact. Typically materials for conductive spacers include, but are not limited to, doped polysilicon; intrinsic polysilicon; copper; aluminum-copper; titanium; titanium silicide; nickel silicide; and cobalt silicide. The spacers 24 are formed using known methods, by depositing a layer of the desired spacer material and then directionally etching the material back to form the spacers. If spacers 24 are desired on one side but not the other, a block mask may be used to protect the desired spacer and the other spacers are etched away.

In the case of SIMOX SOI, it may be desirable to etch into the top region of the silicon substrate to remove the transition region, between the back insulator and single crystal silicon region damaged by the high dose oxygen implantation, to provide a good base for the subsequent epi growth. A P-type epi layer 30 is then grown up from the substrate surface. The epi layer 30 may be grown either selectively or non-selectively. If growth is non-selective, the silicon that grows on the surface of the pad oxide layer may be removed by polishing the entire surface. Non-selective growth may be chosen for the easily controllable reaction conditions and the time savings. Growth conditions are adjusted so that the top surface of the epi is at least as high as the upper surface of the thin polish stop 18. The substrate prior to polishing is shown in FIG. 3.

Figure 4:
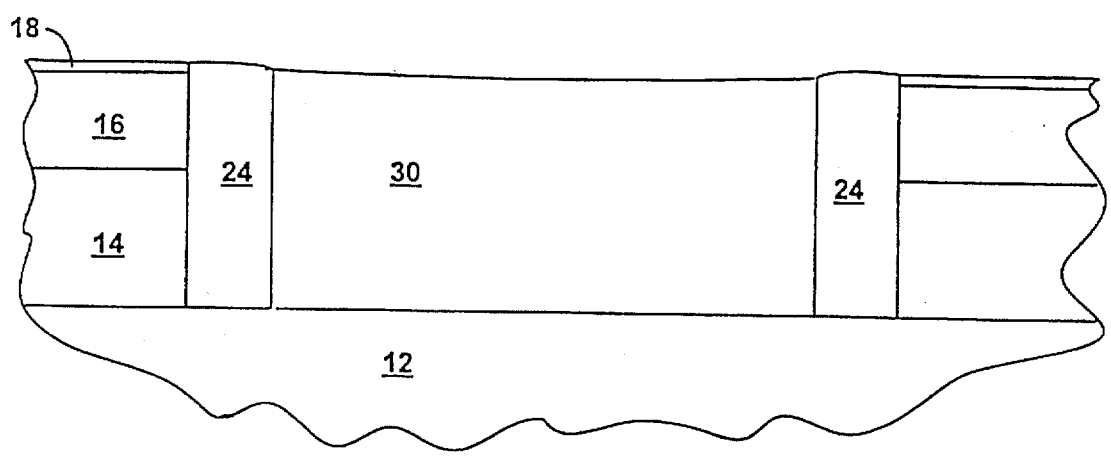
FIG. 4 is a cross-sectional schematic of a fourth step in practicing the method of the present invention.

The entire substrate is then polished to result in the structure shown in FIG. 4. Polishing the epitaxially grown silicon regions requires the use of a polishing slurry that is selective to the oxide and the nitride polish stops. The polishing pad is preferably rigid to avoid excessive recessing of the epi with respect to the polish stop surface. When the epi extends above the top oxide layer, the polishing process would involve two polishing steps. The first step will polish the epi using the oxide layer as the polish stop. This will typically recess the surface of the epi 30 below the oxide surface. If epi growth is controlled well enough to stop before the top of the oxide layer, this first step is unnecessary. After the first polish, the second epi polish will use the nitride as the polish stop. The same pad and slurry may be used in the second step as was used for the first polish. This step planarizes the epi 30 to the top of the nitride 18. The polish times will be determined by the amount of epi growth. The closer the height of the epi 18 is to the height of the nitride stop 18, the less polishing is required. An ideal deposition target, accounting for uniformity and some overgrowth for defects, might be the midpoint of the oxide stop. Since the top surface of the epi should be within a few hundred angstroms of the top of the nitride layer, any dishing that may occur should be minor and not result in depth of focus concerns for the array area relative to the SOI area.

Figure 5:
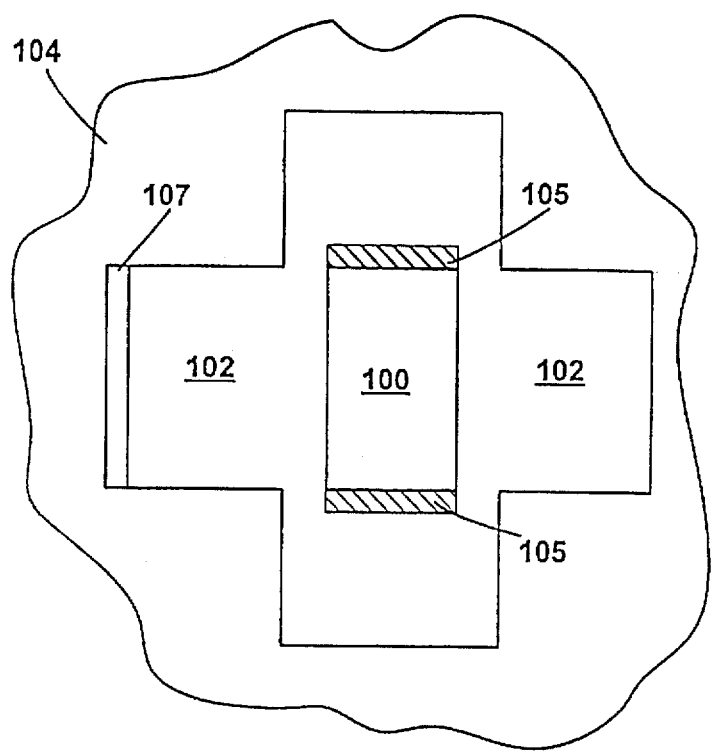
FIG. 5 is a top down schematic of the present invention.

As depicted in FIG. 5, an area 100 of SOI is completely surrounded by a bulk area 102, which is in turn completely surrounded by areas of SOI 104. First or conductive spacers 105 are provided along two edges or a first portion of the perimeter of the interior SOI 100. A second or insulative spacer 107 is provided along one edge or a second portion of the perimeter of the bulk area 102. In the remaining portions of the perimeters, the epitaxially grown silicon is directly in contact with the SOI region. This figure serves to show the flexibility of the present invention because each of these options is available for any of the edges. Various combinations of spacer type may be employed to meet the specific body contact, isolation and thermal sink requirements of the application. For example, the epi may be grown in the opening contacting all the adjacent SOI regions. This provides a body contact to the SOI regions adjacent the opening. This would be used with critical circuitry that would suffer from floating body effects such as passgate metal oxide semiconductor field effect transistors (MOSFET's) or devices requiring close matching such as sense amplifiers or static random access memory (SRAM) cells. The totally contacted epi allows for the creation of fully depleted SOI devices with contacted body and a substrate for bulk devices such as DRAM arrays or applications requiring very low noise.

Insulative spacers on all sides of the SOI allow non-contacted body SOI devices to be constructed adjacent the bulk devices. This provides the maximum performance advantages of SOI when the detrimental floating body effects are not severe enough to result in a loss of device stability, i.e., with grounded source devices that operate with low voltage power supplies, typically less than 1.5 V.

Insulative spacers may be used on one edge of the SOI without spacers on any of the other edges. This arrangement provides layout flexibility for forming combinations of contacted body SOI, bulk, and floating body SOI devices near each other.

Conductive spacers (which may be metallic) may be provided on all sides of the SOI region. This arrangement provides very low electrical resistance and thermal paths from the body of the SOI to the substrate. This is useful for providing stability for higher voltage applications where body current may be relatively large. This also provides improved power dissipation capability for SOI as compared to the arrangement in which the epi is grown contacting the SOI regions.

Figure 6:
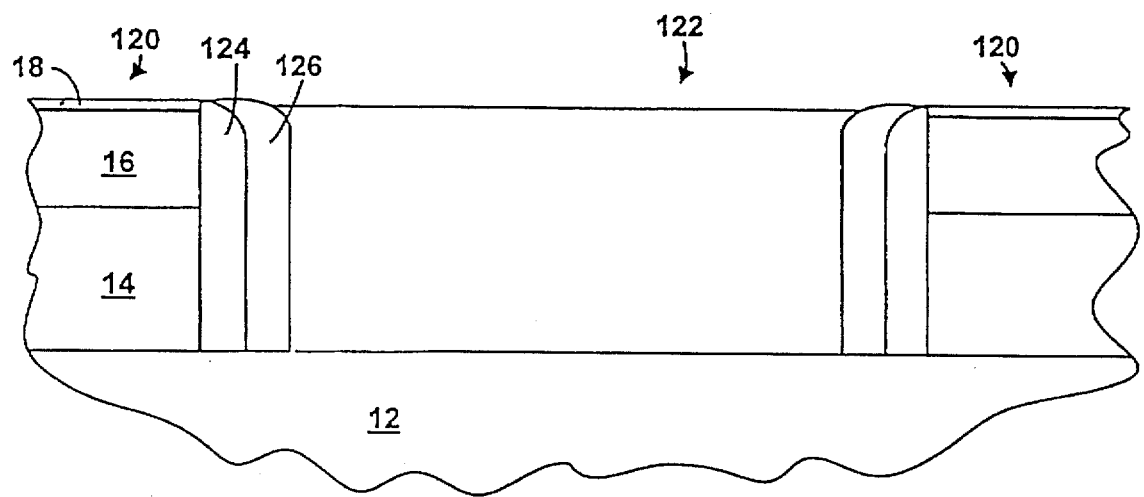
FIG. 6 is a cross-sectional schematic of an alternative final product in accordance with the present invention.

Another alternative arrangement is depicted in FIG. 6. A conductive spacer 124 is formed to first provide the very low resistance path from SOI region 120 to the substrate, and an insulative spacer 126 is formed on the conductive spacer 124 to provide dielectric isolation between the SOI region 120 and the adjacent bulk device region 122. The insulative spacer 126 may also be created in the same step in selected portions of the perimeter where the conductive spacer 124 is not present, and may not be in selected portions of the perimeter where the conductive spacer 124 is present, depending on the desired structure and function of the various parametrial devices. The ability to include portions that are both electrically contacted to the substrate while being dielectrically isolated from the epi region is useful and important for low-noise and mixed analog/digital applications.

While the invention has been particularly shown and described with reference to preferred exemplary embodiments thereof, it will be understood by those skilled in the art that the foregoing and other changes in form and details may be made therein without departing from the spirit and scope of the invention.

Accordingly, what is claimed is:

1. A semiconductor apparatus comprising:
   (a) a single crystalline substrate having a substantially planar surface;
   (b) a first surface area on the planar surface having a semiconductor on insulator region;
   (c) a second surface area on the planar surface being a single crystalline region; and
   (d) a conductive spacer formed only at a first portion of the perimeter of the semiconductor on insulator region connecting the semiconductor of the semiconductor on insulator region to the substrate, the resistivity of the spacer being substantially lower than that of any of the semiconductor regions to which it makes contact.

2. The semiconductor apparatus of claim 1, wherein the single crystalline substrate is a silicon wafer.

3. The semiconductor apparatus of claim 1, wherein the conductive spacer is a material selected from the group consisting of: aluminum; tungsten; doped polysilicon; intrinsic polysilicon; copper; aluminum-copper; titanium; titanium silicide; nickel silicide; and cobalt silicide.

4. The semiconductor apparatus of claim 1, wherein the second surface area is an epitaxially grown silicon material.

5. The semiconductor apparatus of claim 1, further comprising a plurality of devices on the first surface area and the second surface area, and wherein the conductive spacer is formed at the entire perimeter of the semiconductor on insulator region for higher voltage applications of the plurality of devices on the first surface area.

6. The semiconductor apparatus of claim 1, further comprising an insulative spacer formed only at a second portion of the perimeter of the semiconductor on insulator region dielectrically isolating the first surface area from the second surface area in the second portions of the perimeter.

7. The semiconductor apparatus of claim 6, wherein the first surface area directly contacts the second surface area in the remainder of the perimeter not in the first portion or the second portion.

8. The semiconductor apparatus of claim 1, wherein the first portion of the perimeter is the entire perimeter.

9. The semiconductor apparatus of claim 1, wherein the first portion of the perimeter is a portion of the perimeter and wherein the first surface area directly contacts the second surface area in the remainder of the perimeter.

10. The semiconductor apparatus of claim 1, wherein the second surface area has substantially the same crystalline structure as the planar surface.

11. A semiconductor apparatus comprising:
    (a) a single crystalline substrate having a substantially planar surface;
    (b) a first surface area on the planar surface having a semiconductor on insulator region;
    (c) a second surface area on the planar surface being a single crystalline region having substantially the same crystalline structure as the planar surface;
    (d) a conductive spacer formed only at a first portion of the perimeter of the semiconductor on insulator region connecting the semiconductor of the semiconductor on insulator region to the substrate, the resistivity of the spacer being substantially lower than that of any of the semiconductor regions to which it makes contact; and
    (e) an insulative spacer formed at selected portions of the perimeter of the semiconductor, on the conductive spacer, thereby electrically isolating the semiconductor on insulator region from the second surface area single crystalline region.

12. The semiconductor apparatus of claim 11, wherein the single crystalline substrate is a silicon wafer.

13. The semiconductor apparatus of claim 11, wherein the conductive spacer is a material selected from the group consisting of: aluminum; tungsten; doped polysilicon; intrinsic polysilicon; copper; aluminum-copper; titanium; titanium silicide; nickel silicide; and cobalt silicide.

14. The semiconductor apparatus of claim 11, wherein the second surface area is an epitaxially grown silicon material.

15. The semiconductor apparatus of claim 11, further comprising a plurality of devices on the first surface area and the second surface area, and wherein the first portion of the perimeter is the entire perimeter of the semiconductor on insulator region for higher voltage applications of the plurality of devices on the first surface area.

16. The semiconductor apparatus of claim 11, further comprising an insulative spacer formed only at a second portion of the perimeter of the semiconductor on insulator region dielectrically isolating the first surface area from the second surface area in the second portions of the perimeter.

17. The semiconductor apparatus of claim 16, wherein the first surface area directly contacts the second surface area in the remainder of the perimeter not in the first portion or the second portion.

18. The semiconductor apparatus of claim 11, wherein the first portion of the perimeter is the entire perimeter.

19. The semiconductor apparatus of claim 11, wherein the first portion of the perimeter is a portion of the perimeter and wherein the first surface area directly contacts the second surface area in the remainder of the perimeter.

* * * * *